United States Patent [19]
Pascucci et al.

[11] Patent Number: 5,650,671
[45] Date of Patent: Jul. 22, 1997

[54] CHARGE PUMP CIRCUIT

[75] Inventors: Luigi Pascucci, Sesto San Giovanni; Marco Maccarrone, Palestro; Silvia Padoan, Rimini, all of Italy

[73] Assignee: SGS-Thomson Microelectronics S.r.l., Agrate Brianza, Italy

[21] Appl. No.: 379,689

[22] Filed: Jan. 27, 1995

[30] Foreign Application Priority Data

Jan. 28, 1994 [EP] European Pat. Off. ............ 94830030

[51] Int. Cl.$^6$ ................................................. H02M 3/18
[52] U.S. Cl. ........................ 307/110; 327/306; 327/536; 363/60
[58] Field of Search ............................... 307/109, 110; 327/306, 536–538, 541; 331/57; 363/59, 60

[56] References Cited

U.S. PATENT DOCUMENTS

| | | | |
|---|---|---|---|
| 4,656,369 | 4/1987 | Lou | 327/536 |
| 5,036,229 | 7/1991 | Tran | 327/536 |
| 5,191,232 | 3/1993 | Wang | 327/306 |
| 5,235,222 | 8/1993 | Kondoh et al. | 327/541 |
| 5,412,257 | 5/1995 | Cordoba et al. | 327/536 |

FOREIGN PATENT DOCUMENTS 0 405 009   1/1991   European Pat. Off. .

OTHER PUBLICATIONS

Durgavich, "Switching regulator extends battery life," *Electronics International* 56(4):113, Feb. 1983.

*Primary Examiner*—Richard T. Elms
*Attorney, Agent, or Firm*—David V. Carlson; Bryan A. Santarelli; Seed and Berry LLP

[57] ABSTRACT

A charge pump circuit including a number of pull-up stages connected in parallel with one another between a reference potential line and an output line. Each stage includes a capacitor having a first terminal connected to a charging and discharging node, and a second terminal connected to a pull-up node for switching between a first charging operating phase and a second charge transferring operating phase. The charging and discharging node is connected to the supply line via a charging transistor having a control terminal connected to a high-voltage bias node formed by the adjacent stage in the opposite operating phase, for charging the capacitor substantially up to the supply voltage.

23 Claims, 5 Drawing Sheets

5,650,671

1

CHARGE PUMP CIRCUIT

TECHNICAL FIELD

The present invention relates to a charge pump circuit.

BACKGROUND OF THE INVENTION

Charge pump circuits provide for generating a voltage (known as boost voltage) greater than the supply voltage, for catering to the requirements of certain applications. For example, present nonvolatile flash memories at times present a particularly low supply voltage, as low as 3 V, whereas a higher gate voltage is required for reading the cells.

For this purpose, charge pump circuits are based on the principle of alternating two phases, the first of which comprises charging a capacitor, and the second of which comprises pulling up one terminal of the capacitor and connecting the other terminal to an output via controlled switches, to achieve an output voltage greater than supply.

U.S. Pat. 5,191,232, filed by Silicon Storage Technology, relates to a voltage boost circuit (charge pump) for EEPROM memories, comprising a number of cascade-connected stages of the above type, each of which increases the voltage generated in the previous stage, so that the output voltage of the circuit, roughly speaking, equals the supply voltage multiplied by the number of stages. The stages are so timed that each at a given phase is followed by another at the opposite phase, which timing is achieved by means of a number of inverters, one for each stage of the charge pump, cascade-connected in a loop so that the output of the last inverter is connected to the input of the first.

As stated, the above described charge pump provides for boosting the input voltage (supply) when a high input to output voltage ratio is required. However, such a charge pump is unsuitable for applications requiring a lower ratio (e.g., an output voltage equal to twice the input voltage) but high power. In fact, for achieving a low boost ratio, a correspondingly small number of stages must be provided, only one of which is connected directly to the output line. In this case, a very high oscillation frequency, due to the propagation time of the timing pulse in the inverter loop, would be produced. This very high oscillation frequency prevents full charging of the capacitor. Such a situation would in fact result in conflicting requirements: on the one hand, high power capacitors are required for high power charge transfer; on the other, an increase in the capacitance of the capacitors results in a reduction in the charge of the capacitors at each cycle and hence in output power.

Moreover, the efficiency of the known circuit is extremely poor in the presence of low supply voltages, e.g., 3 V. The capacitor of the known circuit, in fact, can only be charged to the input value less the threshold voltage of the diode interposed between the capacitor itself and the previous stage; and, similarly, fails to transfer the full charge, due to the voltage drop of the diode between itself and the next stage (or output).

SUMMARY OF THE INVENTION

It is an object of the present invention to provide a charge pump circuit designed to overcome the drawbacks presented by known circuits, and which in particular provides for supplying high power, especially in the presence of a low input to output voltage ratio or low supply voltage.

2

Figure 1:
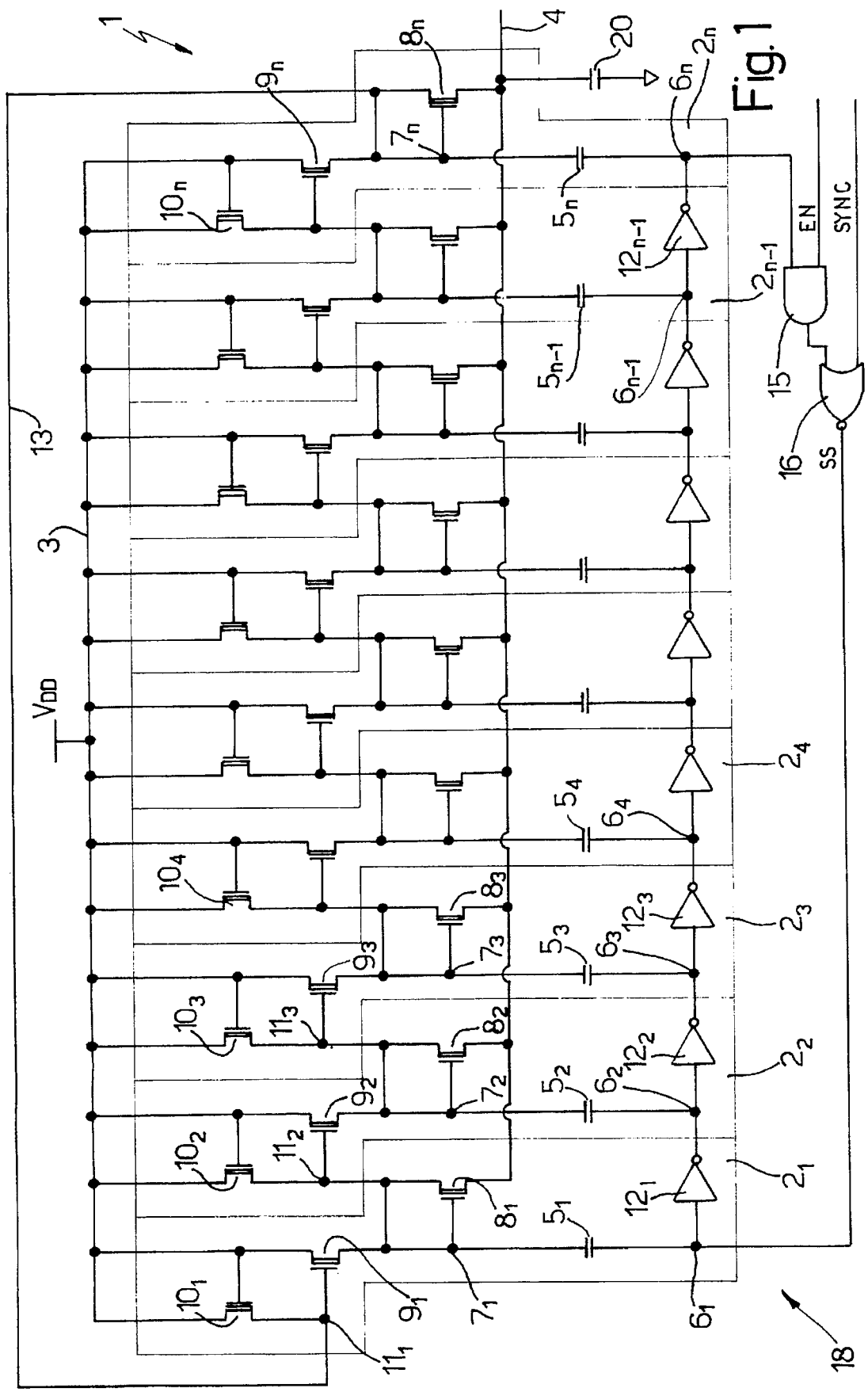
FIGS. 1–4 show four embodiments of the charge pump circuit according to the present invention.
Figure 5:
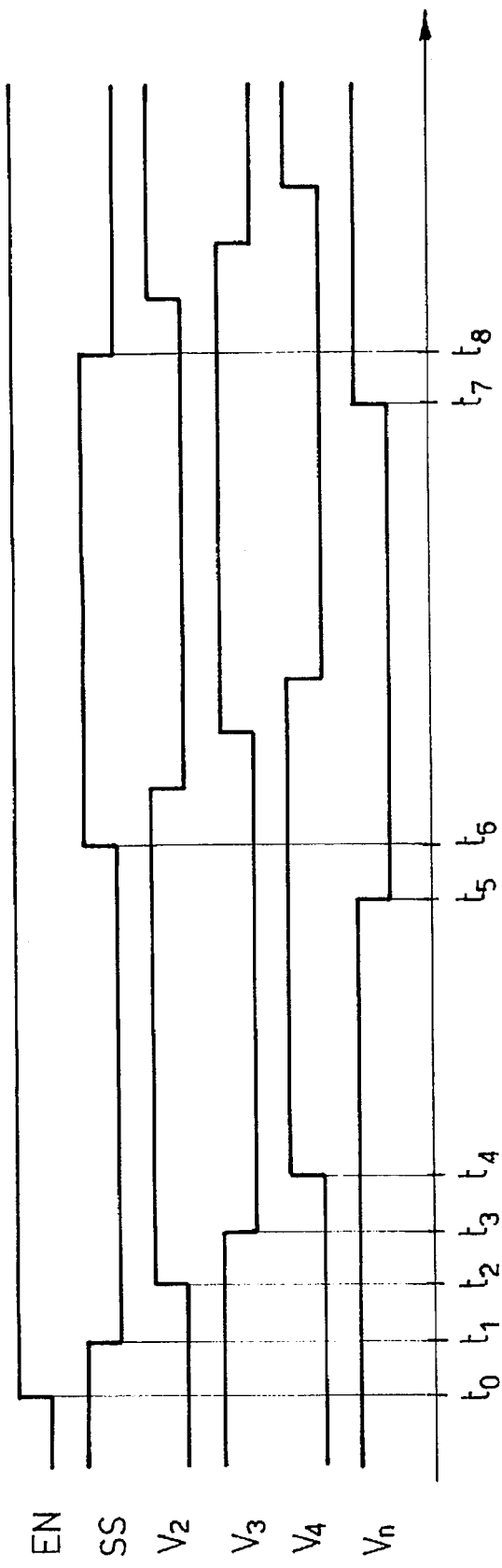

FIG. 5 shows a graph of a number of signals in the FIG. 1 circuit.

Figure 7:
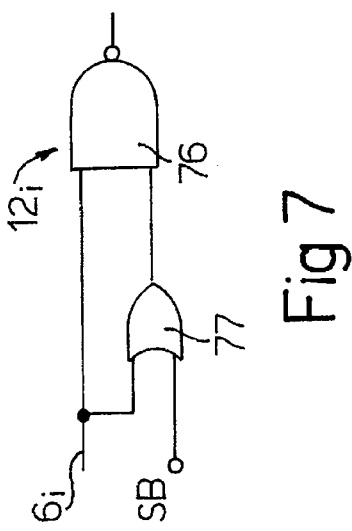
Figure 6:
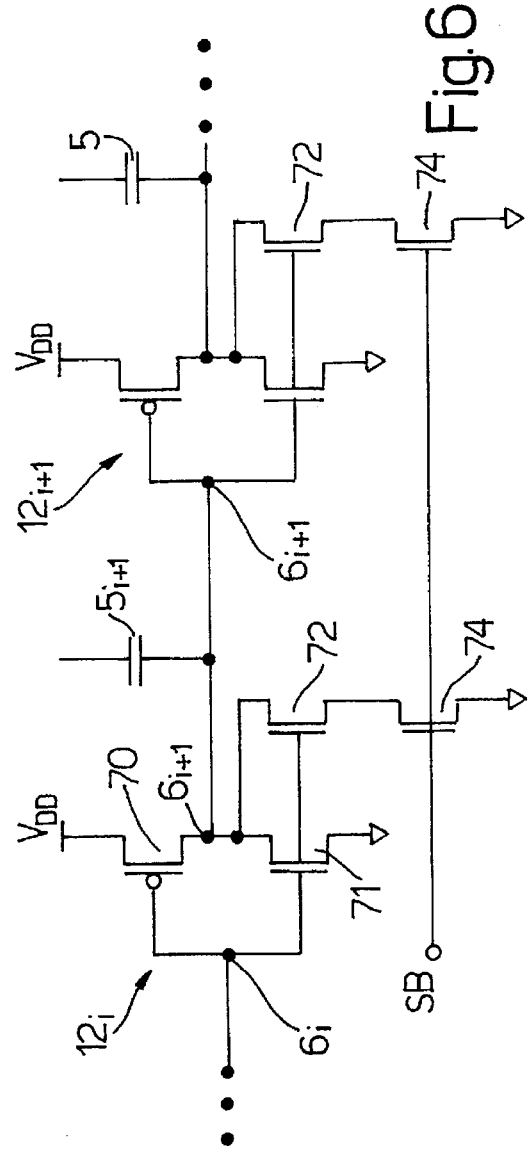

FIGS. 6 and 7 respectively show a circuit arrangement and a logical equivalent of a variation of a detail in the FIG. 1–4 circuits.

DETAILED DESCRIPTION OF THE INVENTION

Reference numeral 1 in FIG. 1 indicates a charge pump circuit comprising a number of stages $2_1$, $2_2$, $2_3$, . . . , $2_n$ connected in parallel with one another between a reference potential line (supply line 3 at potential $V_{DD}$) and an output (or boost) line 4. For the sake of simplicity, the stages and component parts of the stages in the following description are indicated using subscripts to show the location (from left to right) and distinguish between the stages when necessary, and without subscripts when no distinction is required. Stages 2 in fact are substantially identical with the exception of the last stage $2_n$ as explained later on.

Each stage 2 comprises a bootstrap capacitor 5 with terminals defining a first and second node 6 and 7; an output diode 8 interposed between second node 7 and output -line 4; a charge transistor 9 interposed between supply line 3 and second node 7; an idle bias diode 10 interposed between supply line 3 and a node 11 formed by the gate terminal of charge transistor 9; and an inverter 12 interposed between nodes 6 of two adjacent stages 2, with the exception of the last stage $2_n$ on the right, the inverter of which is formed by the branch closing the timing loop, as described below.

In detail, output diode 8 of each stage 2 comprises a native (i.e., low-threshold) N-channel MOS transistor with the drain and gate terminals short-circuited and connected to node 7 of its own stage 2, and the source terminal connected to output line 4; each transistor 9 comprises a native N-channel MOS transistor with the drain and gate terminals connected to supply line 3, and the source terminal connected to node 7 of its own stage 2; and each diode 10 comprises a native N-channel MOS transistor with the drain and gate terminals short-circuited and connected to supply line 3, and the source terminal connected to node 11 of its own stage 2. Node 11 of each stage $2_i$ is connected directly to node $7_{i-i}$ of the previous stage $2_{i-i}$, and node $11_1$ of the first stage $2_1$ on the left is connected by line 13 to node $7_n$ of the last stage $2_n$ on the right to form a loop of stages. The input of inverter $12_i$ of each stage $2_i$ is connected to the output of inverter $12_{i-1}$ of the previous stage; and the output of inverter $12_{n-1}$ of the penultimate stage $2_{n-1}$ on the right (node $6_n$) is connected to a first input of an AND circuit 15, the second input of which is supplied with an external enabling signal EN. The output of AND circuit 15 is connected to a first input of a NOR circuit 16, the second input of which is supplied with a synchronizing signal SYNC; and the output of NOR circuit 16 (supplying signal SS) is connected to node $6_1$ of the first stage $2_1$ on the left.

In practice, NOR circuit 16 constitutes the inverter of stage $2_n$, and together inverters $12_1$–$12_{n-1}$ and NOR circuit 16 (as well as AND circuit 15) form an oscillating loop 18 comprising an odd number of inversions.

A capacitor 20 is connected between line 4 and ground, and acts as a memory level (flywheel element).

The FIG. 1 circuit operates as follows (refer also to the FIG. 5 diagram showing the logic signal at the inputs of inverters 12 of the first four stages). In idle mode, with enabling signal EN and the SYNC signal low, signal SS is high and the circuit is in idle bias mode. In this condition, the input nodes $6_i$ of inverters $12_i$ of odd-position (and oddsubscript) stages $2_j$ where i=2k−1 and k is a whole number, are high; and the input nodes $6_j$ of inverters $12_j$ of even stages $2_j$, where j=2k, are low, as shown in FIG. 5 in which $V_2$, $V_3$ and $V_4$ respectively indicate the logic level of nodes $6_2$, $6_3$ and $6_4$. Consequently, the even stages are biased to supply by turned-on diodes 10 (capacitors 5 charged to $V_{DD}-2V_T$, where $V_T$ is the voltage drop across diodes 10 and between the source and gate terminals of transistors 9), whereas the odd stages are not supplied.

Upon the EN signal switching to high, the charge pump is turned on (instant $t_O$ in FIG. 5); and, after a delay caused by the switching of NOR circuit 16, signal SS switches to low, so as to ground node $6_1$ of the first stage 2I (instant t1); and diode $10_1$ and transistor $9_1$ of first stage 2I are turned on, thus enabling capacitor $5_1$ to be charged to $V_{DD}-2V_T$. After a delay caused by the output of inverter $12_1$ switching to high (instant $t_2$), signal $V_2$ at node $6_2$ switches to roughly $V_{DD}$; node $7_2$ of the same stage $2_2$ switches to roughly $2V_{DD}-2V_T$ thus turning off diode $10_2$ and transistor $9_2$ and turning on diode $8_2$ of second stage $2_2$; and capacitor $5_2$ is connected to output line 4 and, despite being only partly charged and not yet fully efficient, transfers its charge to output line 4 via diode $8_2$.

At the same time, pull-up of node $7_2$ of second stage $2_2$ pulls up node $11_3$ of third stage $2_3$ to the same value $2V_{DD}-2V_T$; and, upon signal $V_3$ at the output of inverter $12_2$ switching to low (with a certain delay with respect to switching of inverter $12_1$—instant $t_3$), capacitor $5_3$ of third stage $2_3$ begins charging. In this case, the capacitor is charged to the full supply voltage $V_{DD}$ value in that, as stated, the gate terminal of transistor $9_3$ of third stage $2_3$ (node $11_3$) is at a higher potential than $V_{DD}$ (i.e., $2V_{DD}-2V_T$), thus enabling node $7_3$ to be connected to supply via charge transistor 9 3 which presents a negligible voltage drop between the drain and source terminals.

Upon signal $V_4$ at the output of inverter $12_3$ of third stage $2_3$ switching to high (instant $t_4$), diode $10_4$ of fourth stage $4_4$ is turned off, and, as in stage $2_2$ capacitor $5_4$ begins transferring its charge to output line 4.

Operation as described above is repeated for the following stages as the switch edge travels along inverters 12, with the even stages transferring the accumulated charge to line 4, and the odd stages charging fully, until the switching edge of the inverters 12 reaches the last stage $2_n$ (instant $t_5$ in FIG. 5). When signal $V_n$ at the output of inverter $12_{n-1}$ of the penultimate stage switches to low, this switches AND circuit 15 which generates a low output signal; NOR circuit 16 and signal SS switch to -high (instant $t_6$); and the switch edge again travels along inverters 12.

In this phase, as inverters 12 are switched, the odd stages $2_1$, $2_3$, ... switch to charge transfer mode, and the even stages to charge mode; and operation of pump 1 is practically regular, in that, with the exception of the first, the odd stages are fully charged. Nodes $7_3$, $7_5$, ... of the odd stages therefore switch successively to $2V_{DD}$ and, taking into account the voltage drop $V_T$ of diodes $8_3$, $8_5$, ..., are capable of bringing line 4 up to $2V_{DD}-V_T$. In this phase, the even stages are also charged fully.

Upon this switch edge reaching the penultimate stage $2_{n-1}$ (instant $t_7$), signal $V_n$ at node $6_n$ switches to high, thus switching circuits 15 and 16; and a new switch edge begins traveling along inverters 12. In this phase, in which the odd stages $2_1$, $2_3'$ ... are charged and the even stages $2_2$, $2_4$, ... transfer the accumulated charge, even the first node can be fully charged. Thanks to line 13, in fact, node 11 is at the potential $2V_{DD}$ as node $7_n$ of the last charge transferring stage, so that, upon signal SS switching (instant $t_8$), transistor $9_1$ is turned on and connects node $7_1$ to supply line 3 at $V_{DD}$.

Operation as described above is repeated cyclically as long as enabling signal EN is high and the SYNC signal is low. If the SYNC signal switches to high, however, when the SS signal is low, upon the switch edge reaching the last stage, oscillation is interrupted until the SYNC signal again switches to low. Conversely, if SS is high, switching of the SYNC signal immediately switches SS to low, and oscillation (asynchronous with respect to the previously oscillations) is recommenced, and is interrupted upon the switch edge reaching the last stage and the pump is stopped. In both cases, therefore, the SYNC signal is valuable for temporarily stopping pump 1—e.g., when address reading, in the event the circuit is used in a memory—without disabling the entire circuit.

Charge pump 1 as described therefore provides for effectively boosting voltage even in case of a low input to output voltage ratio. Providing a large number of parallel stages, in fact, permits a parallel contribution by various stages at each charge transfer phase, as well as allows for allowing sufficient time for the oscillation to travel along inverters 12 and so ensure that, when the same inverter is switched again, it has safely reached the voltage level corresponding to the high or low state. As a result, the capacitors of each stage are also in the best possible condition, and are allowed enough time to be fully charged and to transfer the charge to output line 4.

Moreover, biasing each stage by means of the previous one (and the first stage by the last via line 13) ensures the capacitors are charged, with no losses, up to the supply voltage, and also provides for accelerating the transient state to, the steady state condition, thus enhancing the efficiency of the circuit.

The pump according to the present invention also operates at high frequency. As the pump described is substantially a loop oscillator in which supply current is proportional to frequency, to the capacitance of the charge elements (capacitors) and to operating voltage (supply voltage $V_{DD}$), for a given current and, hence, efficiency, the high frequency of the pump provides for reducing the size of the capacitors and, despite featuring a large number of parallel stages, for greatly reducing the size of the pump as a whole.

The efficiency of the FIG. 1 circuit is further enhanced by the fact that, at each instant, there are always some stages transferring a charge to output line 4, with no ineffective half cycles in which the stages are charged and no charge is transferred, as would be the case if only one stage were connected to the output line.

Figure 2:
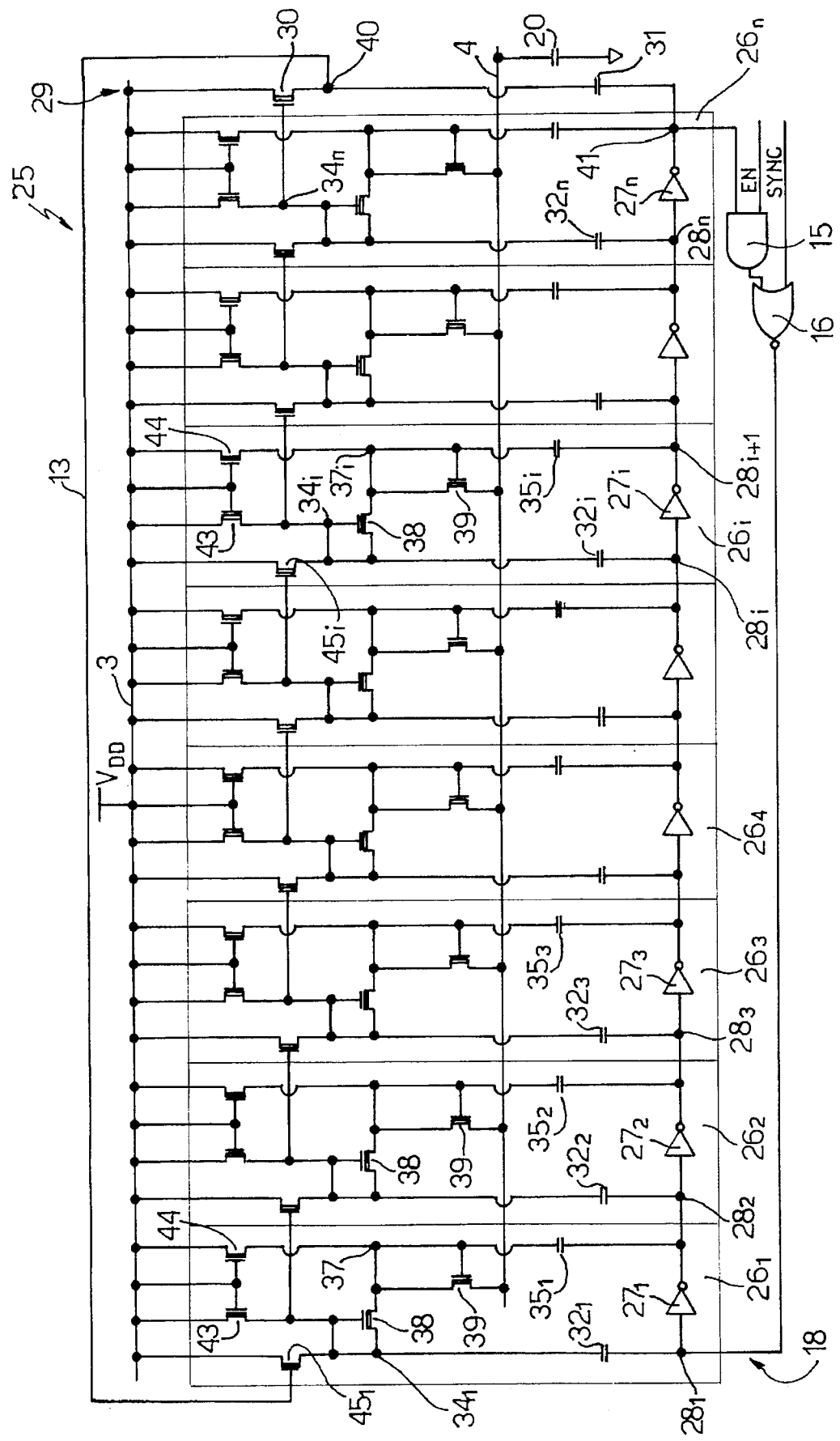

FIG. 2 shows a further embodiment of the pump, indicated 25, which provides for achieving a higher input to output voltage ratio.

In this case also, pump 25 comprises a number of stages $26_i$ connected in parallel with one another between supply line 3 and output line 4; and an oscillating loop 18 formed by a number of inverters $27_i$ and circuits 15, 16. (Here, too, unless required for operating description purposes, stages 26 are generally indicated without subscripts). A branch 29 is provided for biasing first stage $26_1$ which extends between lines 3 and 4 and presents the same structure as part of stages 26, as described below.

Each inverter $27_i$ defines an input node $28_i$ and an output node $28_{i+i}$, connected to the input of inverter $27_{i+i}$ of the next stage.

Each stage 26 comprises a first capacitor 32 having a first terminal connected to node $28_i$, and the other terminal of which defines a node $34_i$; and a second capacitor 35 having a first terminal connected to node $28_{i+i}$, and the other terminal of which defines a node 37. A first charge transfer diode 38 is connected between nodes 34 and 37; a second charge transfer diode 39 is connected between each node 37 and output line 4; a first idle bias diode 43 connects the anode of charge transfer diode 38 and node 34 to supply line 3; a second idle bias diode 44 connects the anode of charge transfer diode 39 and node 37 to supply line 3; and a transistor $45_1$ presents its drain and source terminals connected respectively to supply line 3 and node $34_i$ and its gate terminal connected to node $34_{i-1}$ of the previous stage. Branch 29 comprises a capacitor 31 identical to capacitors 32; and a transistor 30 identical to transistors 45 of stages 26. More specifically, capacitor 31 presents a first terminal connected to a node 41 formed by the output of inverter $27_n$ of the last stage $26_n$, and a second terminal defining a node 40 and connected to the source terminal of transistor 30 which presents the gate terminal connected to node $34_n$, and the drain terminal connected to line 3. Node 40 is connected by line 13 to the gate terminal of transistor $45_1$ of first stage $26_1$; and node 41 is connected to one input of AND circuit 15.

Each diode 38, 39, 43 and 44 comprises a native N-channel MOS transistor with short-circuited drain and gate terminals; and each transistor $45_i$ and 30 comprises a native NMOS transistor.

The FIG. 2 circuit operates in the same way as the FIG. 1 circuit, except that it provides for bringing the output line up to a voltage of $3V_{DD}-2V_T$.

In fact, in steady state mode, upon node $28_n$ of the last stage $26_n$ switching to low (O V), capacitor $32_n$ begins charging, and its terminal $34_n$ switches to $V_{DD}$ together with the gate terminal of transistor 30; and, upon switching of the output of inverter $27_n$ node 41 switches to high, thus enabling capacitor $35_n$ to transfer its charge to output line 4. In this phase, node 40 switches to $2V_{DD}$ together with the gate terminal of transistor $45_1$, so that, as the switch edge advances and node $28_1$ switches to low to commence charging capacitor $32_1$, this can be charged to the full supply voltage $V_{DD}$; and second capacitor $35_1$ transfers its charge to output line 4.

As the switch edge goes on along inverters 27, first capacitor $32_2$ of the second stage switches to transfer its charge to second capacitor $35_2$ which in turn switches to the charge phase; first capacitor $32_3$ of the third stage switches to the charge phase up to $V_{DD}$, and so on. In the next half cycle, following propagation of the switch edge along oscillating loop 18, first capacitors $32_1$, $32_3$, etc., which were formerly charging, transfer the charge to respective second capacitors $35_1$, $35_3$, etc. As said first capacitors were charged to the full supply voltage $V_{DD}$, when nodes $28_1$, $28_3$, etc. switch to high, nodes $34_1$, $34_3$, . . . present voltage $2V_{DD}$, and respective second capacitors $35_1$, $35_3$, . . . can be charged to $2V_{DD}-V_T$, where $V_T$ is the voltage drop- of diodes 38. In the same half cycle, first capacitors $32_2$, $32_4$, etc. switch to the charge phase, and second capacitors $35_2$, $35_4$, etc. switch to transfer the charge to output 4. More specifically, in this phase, second capacitors $35_2$, $35_4$, etc., which were formerly charged to $2V_{DD}-V_T$, are capable of bringing output line 4 up to $3V_{DD}-2V_T$, taking into account the voltage drop of diodes 39.

Like the FIG. 1 circuit, therefore, stages 26 switch one after the other; signal EN provides for enabling and disabling the circuit, and the SYNC signal for temporarily interrupting operation; and each stage is biased, in steady state mode, by the previous stage to ensure full charging of capacitors 32 to $V_{DD}$ with minimum losses.

Figure 3:
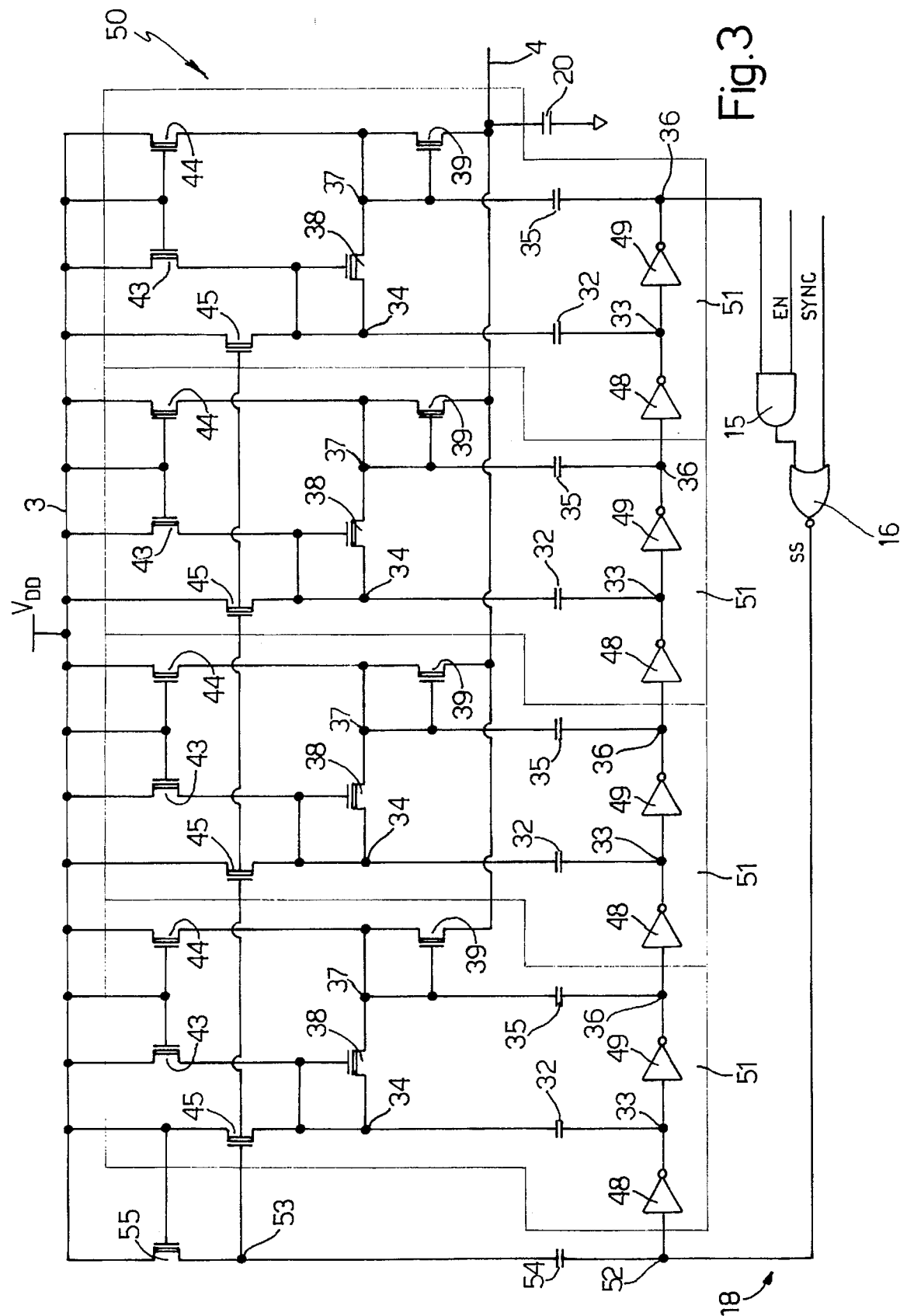

Like circuit 25 in FIG. 2, circuit 50 in FIG. 3 comprises a number of parallel stages 51, each for supplying an output voltage of $3V_{DD}-2V_T$. Stages 51 are similar to stages 26 in FIG. 2, except that, as opposed to each stage 51 being connected to node 34 of the previous stage, the gate terminals of transistors 45 are all connected to one node 53, and each stage 51 comprises two inverters 48, 49.

More specifically, for each stage, the output of inverter 48 defining node 33 is connected to the input of inverter 49, the output of which defines node 36; and first capacitors 32 are connected between nodes 33 and 34, and second capacitors 35 between nodes 36 and 37. In all but the first stage on the left, the input of first inverter 48 is connected to node 36 of the previous stage. In the first stage-on the left, the input of inverter 48 (supplied with signal SS) defines a node 52 connected to the output of NOR circuit 16. Node 36 of the last stage on the right is connected to one input of AND circuit 15.

Common bias node 53 is formed by one terminal of a capacitor 54, the other terminal of which is connected to input 52 of inverter 48 of first stage 51. Node 53 is also connected to supply line 3 via a diode 55.

Circuit 50 in FIG. 3 operates in the same way as circuit 25 in FIG. 2, except that, as the switch edge advances, first capacitors 32 all switch to the same condition—charge or charge transfer—as do second capacitors 35, so that all the stages operate in time with one another. Consequently, in the FIG. 3 circuit, the propagation delay of each stage equals the total delay generated by inverters 48 and 49. What is more, in this case, capacitor 54 is charged in one half cycle to voltage $V_{DD}-V_T$, and, in the opposite half cycle, brings node 53 up to voltage $2V_{DD}-V_T$ and appropriately biases stages 51 as soon as they switch to the charge phase.

Figure 4:
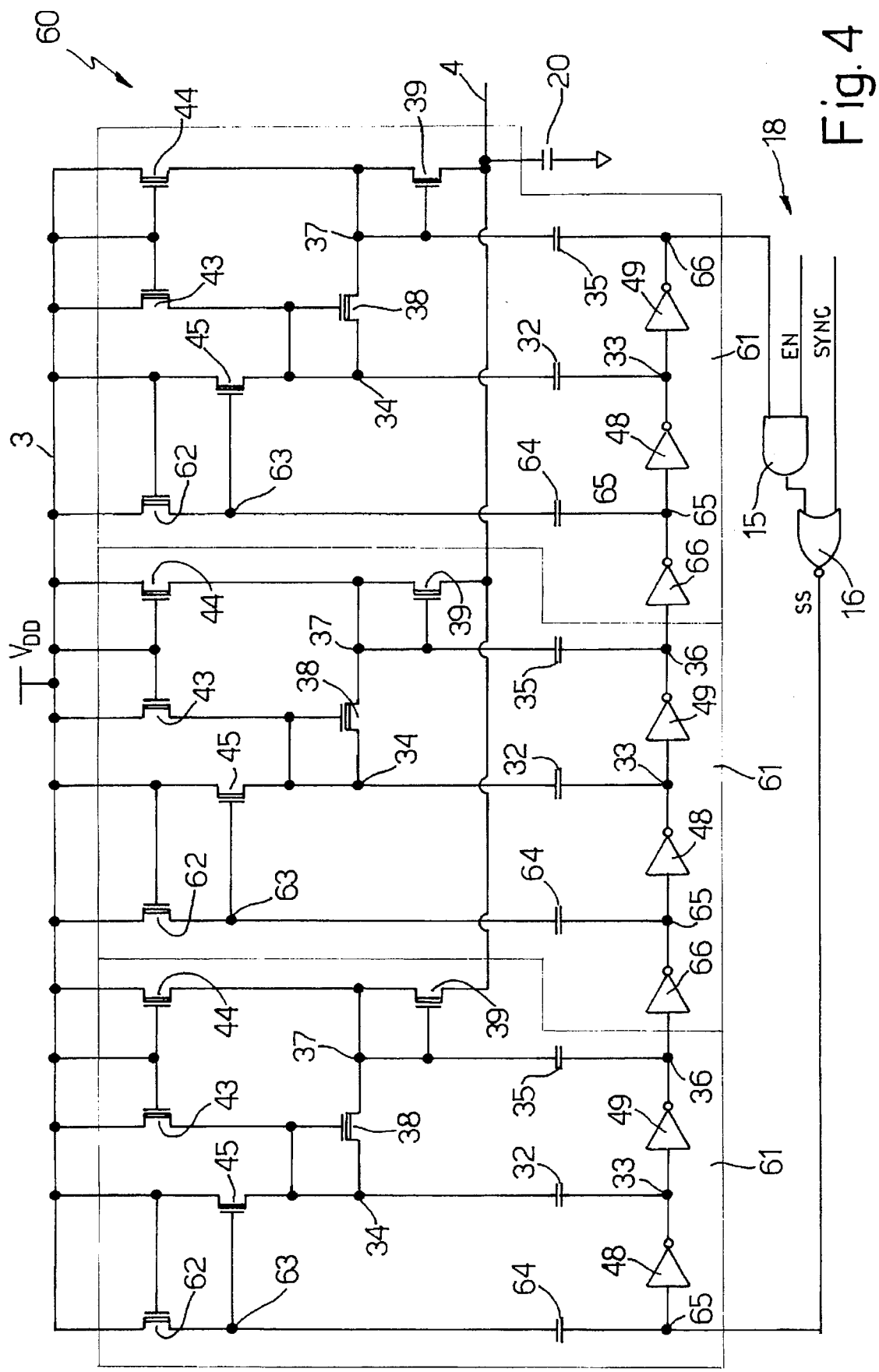

Circuit 60 in FIG. 4 is similar to that of FIG. 2, except that, in steady state mode, each stage 61 is not biased by the previous stage, but presents its own biasing means similar to bias components 53–55 of stages 51 in FIG. 3. Consequently, in addition to components 32, 35, 38, 39, 43–45, 48, 49, each stage 61 in FIG. 4 also comprises a diode 62 interposed between supply line 3 and the gate terminal of transistor 45 (node 63); and a third capacitor 64 having one terminal connected to node 63, and the other terminal (node 65) connected to the input of inverter 48 and, for all but the first stage on the left, to the output of an inverter 66, the input of which is connected to output 36 of inverter 49 of the previous stage.

Input node 65 of inverter 48 of the first stage is connected to the output of NOR circuit 16, the input of which is connected to AND circuit 15 as in circuits 1, 25 and 50 in FIGS. 1–3.

Circuit 60 in FIG. 4 operates in the same way as described for circuits 25 and 50. In the first phase, capacitor 64 is charged to voltage $V_{DD}-V_T$, where $V_T$ is the voltage drop across diode 62; and, in the meantime, capacitor 32 transfers its charge to capacitor 35 which is charged to $2V_{DD}-V_T$. In the next phase, node 63 is brought up to voltage $2V_{DD}-V_T$, so that capacitor 32 is charged fully to supply voltage $V_{DD}$ via transistor 45; and capacitor 35 transfers its charge to output line 4 to bring it up to voltage $3V_{DD}-2V_T$.

FIGS. 6 and 7 show a different embodiment of inverters 12, 27, 48, 49 and 66 in the FIG. 1–4 circuits, which allows consumption of the circuits to be reduced by reducing the operating frequency.

As shown in FIG. 6, each inverter is formed by a pair of opposite-channel MOS transistors, one of which is divided into two unbalanced parts, of which one is switchable by an external signal, for controlling the current through the transistor and, hence, the switching time of the inverter.

More specifically, each inverter (e.g., inverter $12_i$ in FIG. 1) comprises a P-channel transistor 70 and an N-channel transistor 71, the gate terminals of which are connected together and to the input node $6_i$ of inverter $12_i$. Transistor 70 presents the source terminal connected to supply $V_{DD}$, and the drain terminal (node $6_{i+1}$) connected to the drain terminal of transistor 71, the source terminal of which is grounded. The gate and drain terminals of transistor 71 (of minimum size) are connected respectively to the gate and drain terminals of an N-channel transistor 72; and the source terminal of transistor 72, which has a much larger width than transistor 71 to enable it to conduct far more current, is grounded via a switch 74. Switch 74 comprises an N-channel MOS transistor, is the same size as transistor 72, and is supplied at the gate terminal with a control signal SB, e.g., relative to the operating mode of the device featuring the charge pump circuit according to the present invention.

FIG. 7 shows the logic equivalent of one of the FIG. 6 inverters, which comprises a two-input NAND circuit 76 with one input connected directly to input node $6_i$, and the other connected to the output of a two-input OR circuit 77, one input of which is connected directly to input node $6_i$, and the other input of which is supplied with signal SB.

When signal SB of the FIG. 6–7 inverters is high, transistors 71 and 72 operate in parallel with each other, so that, when node $6_i$ switches to high, they are turned on and provide jointly for discharging node $6_{i+1}$. Conversely, when signal SB is low, transistor 72 is turned off, and transistor 71 alone provides for discharging the current from node $6_{i+1}$ to ground. Since transistor 71 is much smaller than transistor 72, it conducts much less current and therefore takes longer to discharge node $6_{i+1}$. As a result, inverter 12 takes longer to switch and the inventor circuitry provides for a means for reducing the power consumption and the operating frequency of the charge pump circuit.

The detailed description provided above will enable those skilled in the art to make modifications to the described preferred embodiments that do not depart from the spirit and scope of the present invention. In particular, the number of stages may vary, providing the oscillating cycle is long enough to switch the inverters, charge and discharge the capacitors, and so ensure correct operation of the circuit; each stage may provide for a different input to output voltage ratio as required; provision may be made for modifying operating frequency, as described above, or for modifying the number of active stages in predetermined operating phases of the device featuring the charge pump; and, finally, bipolar switch elements may also be employed. In light of the foregoing, the present invention encompasses all such modifications that read upon the appended claims and equivalents thereof.

We claim:

1. A charge pump circuit comprising:
a number of pull-up stages wherein each stage comprises charge storing means having a first terminal connected to a charging and discharging node, and a second terminal connected to a pull-up node for switching between a first charging operating phase and a second charge transferring operating phase; and wherein each pull-up stage has a potential input connected to a potential line and a charge transfer output connected to an output line such that said pull-up stages are connected in parallel with one another between said potential line and said output line.

2. A circuit as claimed in claim 1, wherein:
said charge storing means comprise a first capacitor element;
said charging and discharging node is connected to said potential line via a first switching element;
said first switching element comprises a charging transistor having a first and second terminal connected respectively to said potential line and said charging and discharging node, and a control terminal connected to a high-voltage bias node, for charging said first capacitor element to substantially the potential of said potential line.

3. A circuit as claimed in claim 2, wherein said control terminal of said charging transistor is connected to said charging and discharging node of an adjacent stage in the opposite operating phase.

4. A circuit as claimed in claim 3, wherein each said pull-up stage presents the control terminal of its charging transistor connected to the charging and discharging node of a first adjacent stage, and its charging and discharging node connected to the control terminal of the charging transistor of a second adjacent pull-up stage differing from the first adjacent pull-up stage.

5. A circuit as claimed in claim 3, further including a common bias branch including a first capacitive element having a first terminal connected to said potential line via a second switching element, and a second terminal connected to its own pull-up node, said first terminal of said first capacitive element defining a common bias node; and the control terminals of said charging transistors of all the pull-up stages are connected to said common bias node.

6. A circuit as claimed in claim 3, wherein each pull-up stage comprises a bias branch including a second capacitive element having a first terminal connected to said potential line via a second switching element, and a second terminal connected to its pull-up node; and the control terminal of each charging transistor is connected to said first terminal of said second capacitive element in the same pull-up stage.

7. A circuit as claimed in claim 2, further including an idle bias element interposed between said potential line and said control terminal of said charging transistor.

8. A circuit as claimed in claim 1, wherein said pull-up nodes are connected to respective inputs of a number of cascade-connected inverting elements.

9. A circuit as claimed in claim 8, wherein said inverting elements are closed-loop connected in an odd number, and form an oscillating loop.

10. A circuit as claimed in claim 9, further including enabling and disabling means along said oscillating loop.

11. A circuit as claimed in claim 9, wherein said inverting elements comprise control means for varying the switching delay of the inverting elements.

12. A circuit as claimed in claim 11, wherein each said inverting element comprises a pair of transistors of opposite type; at least one transistor in said pair having a control terminal and a current supply terminal respectively in common with a control terminal and current supply terminal of an auxiliary transistor controlled by a switch signal.

13. A circuit as claimed in claim 1, wherein said charging and discharging node is connected to said output line via a single third switch element.

14. A circuit as claimed in claim 1, wherein each said pull-up stage comprises second-charge storing means having a first terminal connected to said charging and discharging node via a second switching element, and a second terminal connected to a respective pull-up node; said second charge storing means operating in push-pull manner with respect to said first charge storing means in the same pull-up stage.

15. A circuit as claimed in claim 14, wherein said first terminal of said second charge storing means is connected to said output line via a fourth switch element.

16. A circuit as claimed in claim 14, wherein said first terminal of said second charge storing means is connected to said potential line via a respective bias element.

17. A charge pump circuit having a plurality of pull-up stages, each pull-up stage comprising:

a potential line;

a first diode element having a first terminal and a second terminal, the first terminal coupled to the potential line;

a switch element having a first terminal, a control terminal, and a second terminal, the first terminal coupled to the potential line and the control terminal coupled to the second terminal of the first diode element;

a second diode element having a first terminal and a second terminal, the first terminal coupled to the second terminal of the switch element;

an output line coupled to the second terminal of the second diode element;

a capacitive element having a first terminal and a second terminal, the first terminal coupled to the first terminal of the second diode element;

an inverting element having a first terminal and a second terminal, the first terminal coupled to the second terminal of the capacitive element; and wherein the potential line of all pull-up stages are connected together and the output line of all pull-up stages are connected together such that the pull-up stages are connected in parallel with one another between the potential line and the output line.

18. A circuit stage for use in a charge pump circuit, the circuit stage comprising:

a voltage line;

a first diode element having a first terminal and a second terminal, the first terminal coupled to the voltage line;

a switch having a first path and a second path, the first path coupled to voltage line and the second path coupled to the second terminal of the first diode element;

a second diode element having a first terminal and a second terminal, the first terminal coupled to the voltage line;

a third diode element having a first terminal and a second terminal, the first terminal coupled to the second path of the switch and the second terminal coupled to the second terminal of the second diode element;

a fourth diode element having a first terminal and a second terminal, the first terminal coupled to the second terminal of the third diode element;

an output line coupled to the second terminal of the fourth diode element;

a first capacitive element having a first terminal and a second terminal, the first terminal coupled to the first terminal of the third diode element;

a first inverting element having a first terminal and a second terminal, the first terminal coupled to the second terminal of the first capacitive element; and a second capacitive element having a first terminal and a second terminal, the first terminal coupled to the first terminal of the fourth diode element and the second terminal coupled to the second terminal of the first inverting element.

19. The circuit stage of claim 18 further comprising:

a second inverting element having a first terminal and a second terminal, the second terminal coupled to the first terminal of the first inverting element.

20. The circuit stage of claim 19 further comprising:

a fifth diode element having a first terminal and a second terminal, the first terminal coupled to the voltage potential line, the second terminal coupled to a control terminal of the switch; and a third capacitive element having a first terminal and a second terminal, the first terminal coupled to the second terminal of the fifth diode element, and the second terminal coupled to the first terminal of the second inverting element.

21. A charge pump comprising:

a plurality of pull-up stages, each pull-up stage having a potential input and a charge transfer output, and including:

a diode having a first terminal and a second terminal defining the charge transfer output of the corresponding pull-up stage;

a capacitor having a first terminal connected to the first terminal of the diode and a second terminal connected to a pull-up node, a common node between the capacitor and the diode defining a charge and discharge node connected to the potential input of the corresponding pull-up stage; and wherein the potential inputs of all pull-up stages are connected to a potential line and the charge transfer outputs of all pull-up stages are connected to an output line such that the pull-up stages are connected in parallel with each other between the potential line and the output line.

22. The charge pump according to claim 21 wherein each pull-up stage further comprises a charge transistor connected between the potential input and the charge and discharge node.

23. The charge pump according to claim 22 wherein each pull-up stage further comprises a bias diode connected between the potential input and a control terminal of the charge transistor.

* * * * *